United States Patent
Bae et al.

(10) Patent No.: US 7,695,085 B2
(45) Date of Patent: Apr. 13, 2010

(54) VARIABLE GAIN AMPLIFIER HAVING VARIABLE GAIN DC OFFSET LOOP

(75) Inventors: Hyeon Min Bae, Champaign, IL (US); Naresh Ramnath Shanbhag, Champaign, IL (US); Jonathan B. Ashbrook, Homer, IL (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/856,680

(22) Filed: Sep. 17, 2007

(65) Prior Publication Data
US 2009/0072903 A1    Mar. 19, 2009

(51) Int. Cl.
*B41J 29/38* (2006.01)
*H03F 3/45* (2006.01)

(52) U.S. Cl. .......................................... 347/10; 330/254
(58) Field of Classification Search ................... 347/10, 347/56; 330/308, 310, 254
See application file for complete search history.

(56) References Cited

U.S. PATENT DOCUMENTS

| | | | | |
|---|---|---|---|---|
| 6,141,169 A | * | 10/2000 | Pietruszynski et al. | 360/67 |
| 7,035,351 B1 | * | 4/2006 | Park et al. | 375/327 |
| 7,253,679 B2 | * | 8/2007 | Nishimori | 330/9 |

* cited by examiner

*Primary Examiner*—An H Do
(74) *Attorney, Agent, or Firm*—Workman Nydegger

(57) ABSTRACT

A variable gain amplifier and offset cancellation loop circuit and methods for tracking and correcting DC offset errors that may vary in accordance with the gain of the variable gain amplifier. The circuit is designed to provide tracking of rapid changes in the offset error while maintaining a desired overall frequency response of the combined variable gain amplifier and offset loop. The offset loop cancellation circuit has a wide enough bandwidth to allow the offset cancellation loop to track rapid changes in offset errors that result from rapid changes to the amplifier's gain setting. A control circuit is provided to prevent the large offset cancellation loop bandwidth from having a detrimental effect on the amplifier's overall bandwidth when the amplifier is set to high levels of forward gain by adjusting the offset cancellation loop gain as the forward gain of the amplifier is altered.

16 Claims, 4 Drawing Sheets

VARIABLE GAIN AMPLIFIER HAVING VARIABLE GAIN DC OFFSET LOOP

BACKGROUND OF THE INVENTION

A. Field of the Invention

The invention described herein relates to methods and devices for reducing the DC offset error voltages commonly found in electronic amplifier circuits.

B. Description of the Related Art

In a typical amplifier circuit such as an operational amplifier, it is desirable to have a zero volt output signal when the inputs are at the same voltage. Due to various sources of error including transistor mismatches and process variations, the output of an amplifier typically is non-zero when a zero volt input signal is applied. This is referred to as a DC offset error voltage. An input offset voltage may be applied to the inputs to eliminate the error and cause the output to go to zero volts.

The amount of correction to apply may be determined by a feedback loop circuit referred to an offset cancellation loop, or an offset loop. The offset loop circuit typically measures the DC voltage at the output of the amplifier and uses this as an error signal. The circuit then applies feedback to subtract (or add) a voltage at the input of the amplifier in order to drive the DC component at the amplifier output to zero. Typically the DC component at the output of the amplifier is measured using a low pass filter with a very low cutoff frequency to ensure that only the DC component is captured.

One such prior art configuration is shown in FIG. 1, where the forward gain amplifier 106 has a gain factor G, and the offset loop cancellation amplifier 102 has a gain factor A. The offset error is modeled as a voltage source 110 applied to the input of ideal amplifier 106. The offset amplifier 102 provides a correction signal to signal summing nodes 108, 112 at the input to forward amplifier 106. Note also that the offset amplifier may include its own error source, modeled as voltage source 104.

SUMMARY OF THE INVENTION

Described herein are a variable gain amplifier and offset cancellation loop circuit and methods associated therewith, for tracking and correcting DC offset errors that may vary in accordance with the gain of the variable gain amplifier. The circuit is designed to provide tracking of rapid changes in the offset error while maintaining a desired overall frequency response of the combined variable gain amplifier and offset loop. Specifically, the offset loop cancellation circuit has a wide enough bandwidth to allow the offset cancellation loop to track rapid changes in offset errors that result from rapid changes to the amplifier's gain setting. A control circuit is provided to prevent the large offset cancellation loop bandwidth from having a detrimental effect on the amplifier's overall bandwidth when the amplifier is set to high levels of forward gain by adjusting the offset cancellation loop gain as the forward gain of the amplifier is altered.

In one application suitable for using the circuits and methods described herein, the amplifier and offset loop circuit may be used as an automatic gain control (AGC) amplifier whose gain is adjusted to accommodate input signals of rapidly varying amplitude. For example, in many optical communication systems, systemic power transients may result from the operation of optical add/drop multiplexers. The circuits and methods described herein may be used to track the rapid changes in signal levels as a result of the power transients while still maintaining a desired frequency response at low frequencies so as to prevent signal degradation.

In one embodiment, the amplifier system includes a forward gain amplifier having a forward gain factor, an offset loop amplifier interconnected to the forward gain amplifier to provide negative feedback to the forward gain amplifier to reduce offset voltages present in the forward gain amplifier output, and a gain control circuit for adjusting the gain of both amplifiers. The offset loop amplifier includes a low pass filter having an associated offset low pass cutoff frequency, and the interconnected forward gain amplifier and offset loop amplifier have a combined high pass filter characteristic having an associated lower passband cutoff frequency.

At both high and low levels of forward gain, the combined response is sufficient to allow rapid tracking of offset voltage errors. This is because the offset loop low pass frequency is preferably associated with an expected or estimated power transient frequency. That is, the offset low pass cutoff frequency is set to allow for tracking the power transients, where the power transients may be characterized by their slew rate (or by a sinusoidal frequency having a comparable slew rate). The low pass bandwidth is preferably within a factor of two or four of the predetermined frequency (e.g., factor of ½ to 2, or ¼ to 4). In some embodiments, it may be desirable to provide a low pass bandwidth somewhat less than the power transient frequency in order to ensure that the lower cutoff frequency of the combined response is low enough to accommodate the data signals being processed by the amplifier.

As the forward gain is increased, the gain control circuit reduces the offset gain factor to prevent the lower passband cutoff frequency from increasing beyond a predetermined frequency. The predetermined frequency is associated with a sequence of consecutive identical digits that may occur in the signal being amplified. The cutoff frequency is sufficiently low so as to pass a consecutive identical digit signal having 72 consecutive digits with less than 2 percent signal voltage decay.

One preferred method for cancelling a voltage offset in a variable gain amplifier comprises (i) generating an offset error voltage signal indicative of an offset voltage present at a differential output of a variable gain amplifier, the variable gain amplifier having a forward gain factor; (ii) receiving the offset error voltage signal at an offset loop amplifier, the offset loop amplifier having an offset gain factor, and responsively generating an offset voltage correction signal; (iii) applying the offset voltage correction signal to the variable gain amplifier; and, (iv) simultaneously adjusting the forward gain factor of the variable gain amplifier and the offset gain factor of the offset loop amplifier. Preferably, when the forward gain factor is increased, the offset gain factor is decreased. That is, increasing the forward gain factor tends to increases a lower cutoff frequency of the combined amplifier and offset cancellation loop, whereas decreasing the offset gain factor is done in order to lessen the impact by reducing the amount of increase of the lower cutoff frequency. Thus, the offset gain factor is adjusted to a minimum when the forward gain factor is adjusted to a maximum.

In one preferred embodiment the variable gain amplifier includes an amplification stage having a differential pair of transistors with an emitter degeneration impedance. The offset voltage correction signal may take the form of a differential current source applied to the differential transistor pair. By decreasing the resistance of the variable emitter degeneration resistor, the forward gain factor is increased while simultaneously decreasing the offset gain factor.

In alternative embodiments, the offset voltage correction signal may take the form of a voltage applied to a summation node at the input of the variable gain amplifier. The offset loop gain may then be adjusted by altering the loop amplifier gain (such as by altering a degeneration resistance within a common emitter loop amplifier), or by altering characteristics of the summing nodes.

In some preferred embodiments, the method and circuit is used in an AGC circuit and the forward gain is adjusted in response to signal level detector. The offset loop amplifier preferably includes a low pass filter having an upper cutoff frequency approximately equal to an average power transient frequency associated with the input signal. For a 10 GHz optical transmission system, the upper cutoff frequency may be selected to be between approximately 1 kHz and 6 kHz.

BRIEF DESCRIPTION OF THE DRAWINGS

The objects, features and advantages of the present invention will be more readily appreciated upon reference to the following disclosure when considered in conjunction with the accompanying drawings, in which.

DETAILED DESCRIPTION OF THE PREFERRED EMBODIMENT

Figure 1:
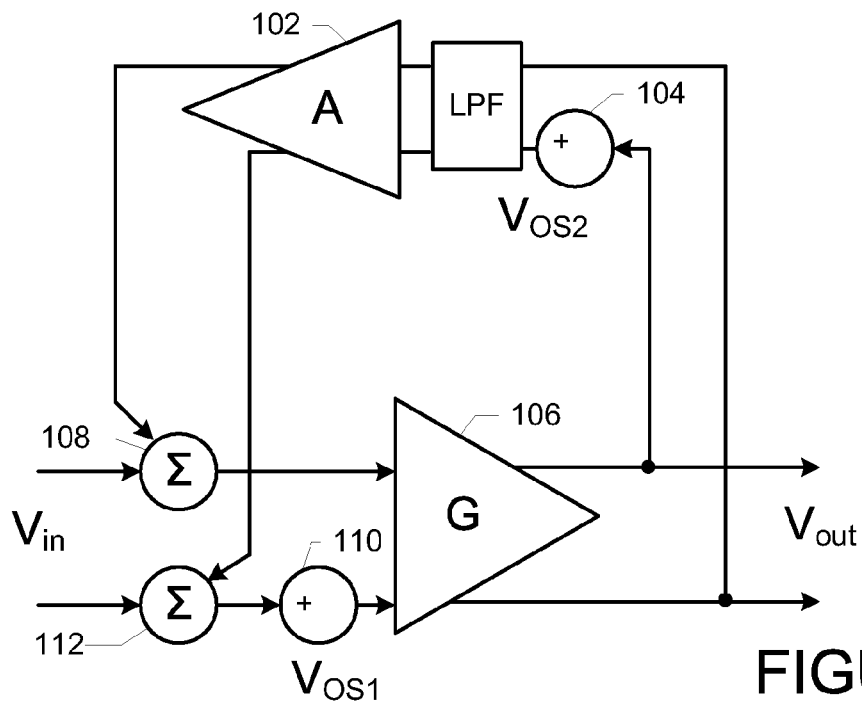
FIG. 1 depicts a prior art amplifier with a DC offset cancellation loop.
Figure 2:
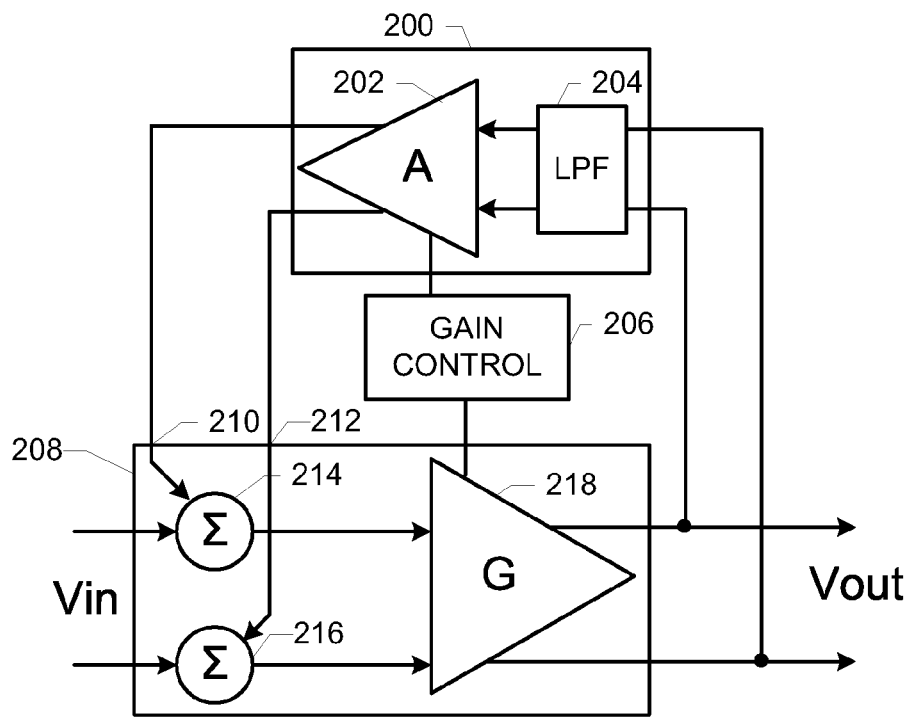
FIG. 2 depicts an improved amplifier with an offset cancellation loop.

With reference to FIG. 2, a variable gain amplifier circuit 208 includes a variable gain amplifier portion 218 that accepts input $V_{in}$ via summing nodes 214, 216 and applies a gain factor G to generate the output voltage $V_{out}$. The output voltage is also applied to offset cancellation loop circuit 200, which includes low pass filter 204 and offset loop amplifier 202 having offset gain factor A. The offset cancellation loop circuit 200 provides negative feedback to the forward gain amplifier circuit 208. The feedback acts to correct for DC offset errors that may be present in the output of forward gain amplifier 218. The forward gain factor G is variable, and the amount of offset error may vary in accordance with the forward gain of amplifier 218.

In the embodiment shown in FIG. 2, the low pass filter 204 generates an offset error voltage signal indicative of an offset voltage present at the output of variable gain amplifier 218. The low pass filter 204 of the offset loop cancellation circuit 200 has a wide enough bandwidth to allow the offset cancellation loop 200 to track rapid changes in offset errors that result from rapid changes to the amplifier's gain setting G. The offset error voltage signal is amplified by amplifier 202 and is applied as an offset voltage correction signal to forward amplifier circuit 208 via nodes 210, 212. In this embodiment, the offset voltage correction signal is shown as a voltage signal.

The gain control circuit 206 adjusts the offset cancellation loop gain A as the forward gain G of the amplifier 218 is altered. The offset loop gain may be adjusted by altering the gain A of loop amplifier 202 or by altering the characteristics of the summing nodes 214, 216, such as by increasing a resistance associated with inputs on nodes 210, 212, for example.

Figure 3:
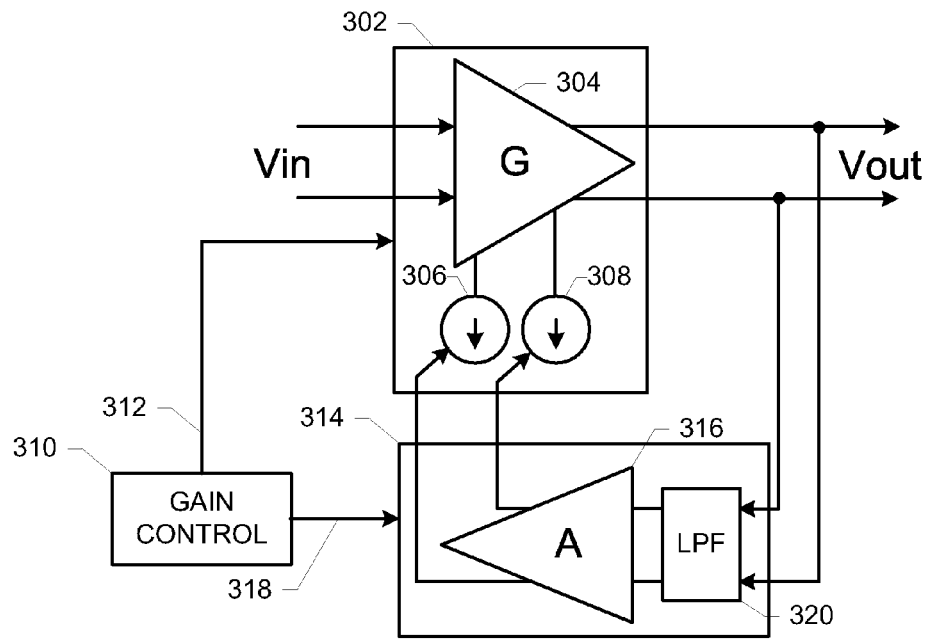
FIG. 3 depicts an alternative embodiment of an amplifier with an offset cancellation loop.

In an alternative embodiment as shown in FIG. 3, the forward gain amplifier circuit 302 includes amplifier 304 and current sources 306, 308. The output of amplifier 304 is provided to offset loop circuit 314, which includes low pass filter 320 and offset loop amplifier 316. The low pass filter 320 generates an offset error voltage signal indicative of an offset voltage present at the output of variable gain amplifier 304. The low pass filter 320 of the offset loop cancellation circuit 314 has a wide enough bandwidth to allow the offset cancellation loop 314 to track rapid changes in offset errors that result from rapid changes to the amplifier's gain setting G. The offset error voltage signal is amplified by amplifier 316 and is applied as an offset voltage correction signal to forward amplifier circuit 302 via current sources 306, 308. In this embodiment the offset voltage correction signal takes the form of a current that is mirrored to the current sources 306, 308.

The offset loop is able to track rapid changes in offset voltage errors resulting from rapid changes in forward gain G. This is because the offset loop low pass frequency P is preferably associated with an expected or estimated power transient frequency. That is, the offset low pass cutoff frequency P is set to allow for tracking the power transients, where the power transients may be characterized by their slew rate (or by a sinusoidal frequency having a comparable slew rate). The low pass bandwidth P is preferably within a factor of two or four of the predetermined frequency (e.g., factor of ½ to 2, or ¼ to 4). In some embodiments, it may be desirable to provide a low pass bandwidth somewhat less than the power transient frequency in order to ensure that the lower 3 $dB$ cutoff frequency of the combined response is low enough to accommodate the data signals being processed by the amplifier system. In some preferred embodiments, the low pass bandwidth is below the power transient frequency by a factor of approximately 3.

Figure 4:
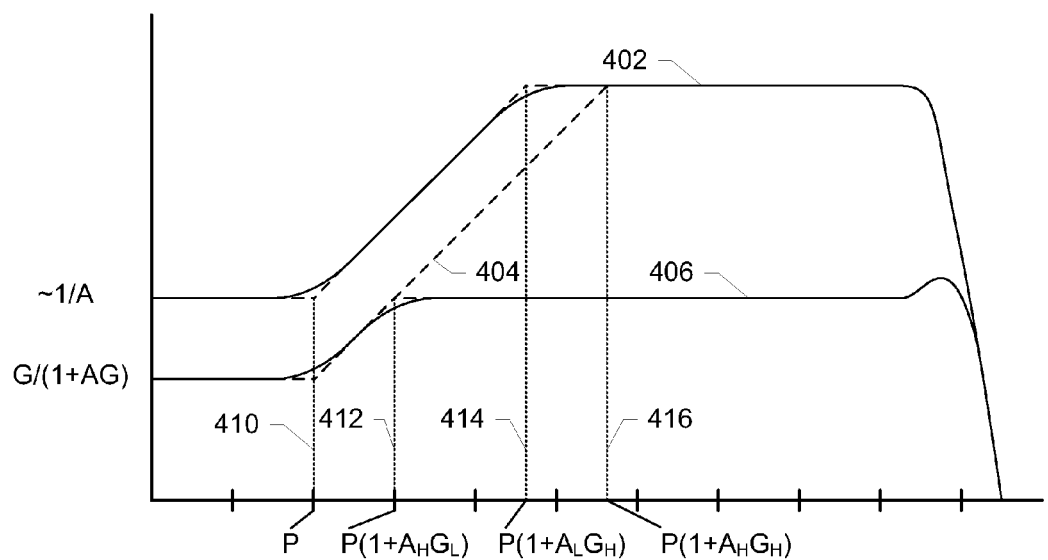
FIG. 4 depicts a frequency response characteristic of the combined amplifier and offset cancellation loop.

The frequency response of the combined forward amplifier and offset loop amplifier is shown in FIG. 4. The curve 402 shows the frequency response when the forward amplifier is set to a high forward gain factor $G_H$ and a low offset loop gain factor $A_L$, while curve 406 shows the response with a low gain factor $G_L$ and high gain factor $A_H$. Curve 406 has a lower 3$dB$ cutoff frequency 412 associated with a transfer function pole at frequency $P(1+A_H G_L)$ and curve 402 has a lower 3$dB$ cutoff frequency 414 associated with a transfer function pole at $P(1+A_L G_H)$. Both curves have a zero at the frequency P 410, which is contributed by the offset loop low pass filter 204, 320 having a low pass cutoff frequency of P. The DC gain of the system is G/(1+AG), resulting in a gain of $G_L$/(1+$A_H G_L$) for curve 406, and a DC gain of approximately 1/$A_L$ for curve 402.

The gain control circuit 206, 310 is provided to prevent the relatively large offset cancellation loop bandwidth P from having a detrimental effect on the amplifier's overall bandwidth when the amplifier is set to high levels of forward gain G. As described above, the offset cancellation loop contributes a pole at frequency P(1+AG) to the overall transfer function of the system. As the forward gain is increased, the gain control circuit 206, 310 reduces the offset gain factor A to reduce the amount that the lower passband cutoff frequency 412 is increased. As shown in FIG. 4, note that line 404 shows the response that would result if the pole was not repositioned by decreasing gain A when gain G is increased. The lower cutoff frequency would occur at frequency $P(1+A_H G_H)$ 416. For example, in an amplifier having forward gain G that increases from $G_L$=1 to $G_H$=100, the offset loop gain A may be adjusted so that A decreases from $A_H$=10 to $A_L$=1. The pole resides at 11 P at $A_H G_L$, and moves to 101P at $A_L G_H$, rather than 1001 P. Thus, by altering the gain of the offset loop amplifier, the lower 3dB cutoff frequency of the combined system may be reduced by a full decade under high forward gain conditions.

It may be desirable to establish a minimum lower 3dB frequency, which may also be determined by a desired response at a related frequency. In one preferred embodiment, a desired response criterion may be established for a signal associated with a sequence of consecutive identical digits that may occur in the signal being amplified. The lower 3dB cutoff frequency may be established to be sufficiently low so as to pass a consecutive identical digit signal having consecutive digits with only a small amount of signal attenuation, such as less than a 1 or 2 percent signal voltage decay. As one specific example, a 72 consecutive digit signal resembling a pulse having a duration of 7.2 nanoseconds. It is desired to have the lower 3dB cutoff frequency to be no greater than XX MHz so that the pulse amplitude does not decay more than 1%.

With respect to FIG. 5, one preferred embodiment of a forward gain amplifier circuit will be described. The amplifier includes current sources 526, 628, 530, 532, a first transistor pair 514, 516, a second transistor pair 506, 508, resistors 502, 504, 524, and gain control transistors 512, 522. The pair of transistors 514, 516 form a differential amplifier with emitter degeneration resistance formed by the parallel combination of $R_4$ and FET 522. The differential amplifier has a gain that is approximately inversely proportional to the degeneration resistance. Thus, the gain is maximized when FET 410 is biased to conduct, and is reduced as the FET is turned off. The transistors 506, 508 form a wideband buffer amplifier in the form of an emitter follower stage that may be used to adjust the common mode voltage for any following stages of the amplifier. Note that the amplifier also includes a second gain control via PMOS transistor 512. As the FET 512 is turned on, the forward gain G of the amplifier is decreased. The second gain control is optionally included to extend the range of the forward gain factor G.

Figure 6:
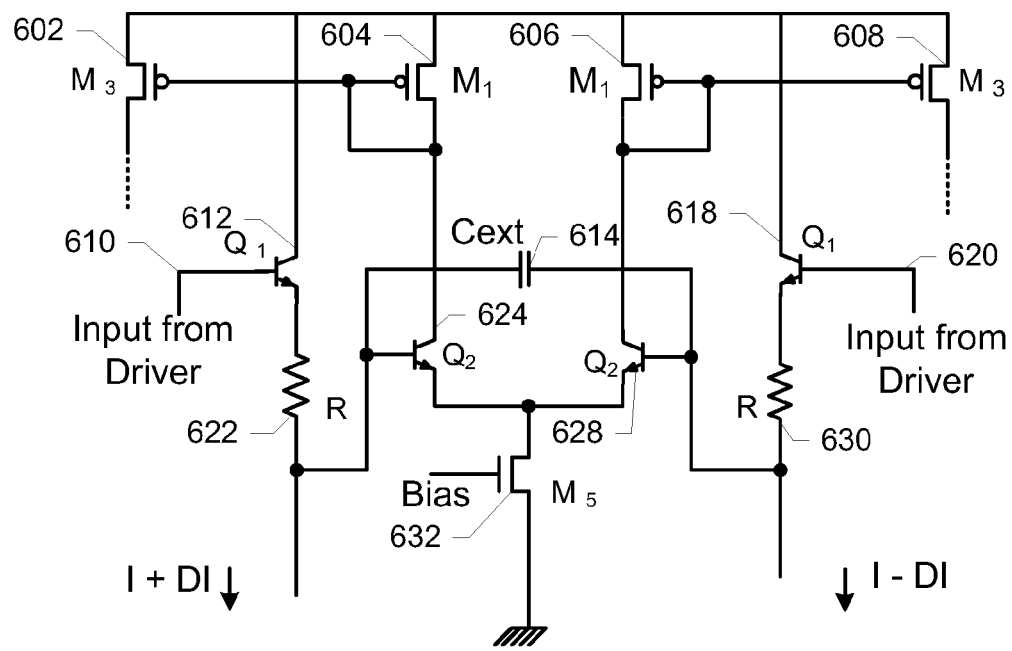
FIG. 6 depicts a circuit diagram of an offset loop amplifier.

FIG. 6 shows one specific circuit for use as a low pass filter 204, 320 and offset amplifier feedback. The circuit includes transistor pairs 612, 618 and 624, 628, bias FET 632, resistors 622, 630, capacitor 614, FETs 602, 604, 606, 608. The output of the final driver stage of the amplifier circuit 208, 302, is provided on nodes 610, 620 to transistor pair 612, 618 and is low pass filtered by resistors 622, 630 and capacitor 614, which sets the pole of the low pass filter equal to RC/2. The capacitor 614 will develop a voltage in the presence of a DC offset error component that may be present in the output of the forward gain amplifier. The offset voltage error signal across capacitor 614 is then used to control transistor pair 624, 628 to generate a differential current, which is also passed through FETs 604, 606. The current in FETs 604, 606 are mirrored, in turn, to FETs 602, 608, respectively.

Figure 5:
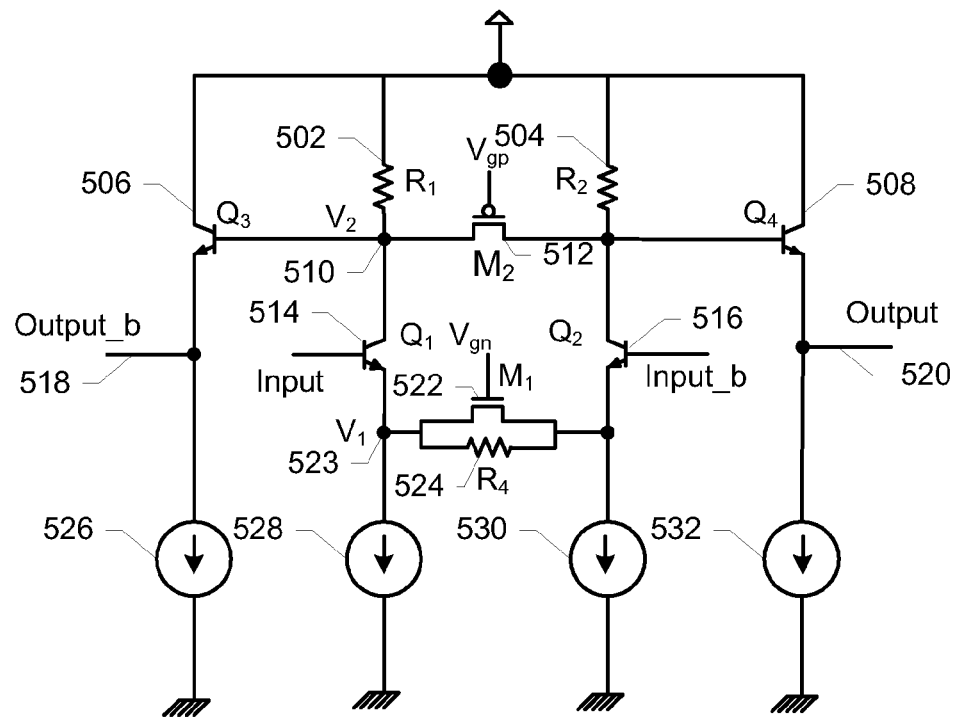
FIG. 5 depicts a circuit diagram of an amplifier.

The currents in FETs 602, 608 are then mirrored to provide current sources 528, 530 of the amplifier shown in FIG. 5. Thus, the differential current applied to the emitters of transistor pair 514, 516 acts as an offset voltage correction signal because it imposes an offset in the output voltages of the collectors of transistors 514, 516. In this way, offset voltages that are inherent in transistors 514, 516 as well as the cumulative effects of the other gain stages of the amplifier circuit 302, are corrected for. Note that the gain of the offset loop amplifier shown in FIG. 6 may be adjusted in numerous ways, including selectively amplifying the differential current FETs 604, 606. Note, however, that in the preferred embodiments of FIG. 5 and FIG. 6, the adjustment to the degeneration resistance $R_4$//FET 522 to increase the forward gain factor G results in a decrease to the effective gain of the offset loop amplifier A. That is, at low gain G, there is a higher degree of isolation between the emitters of transistors 514, 516 (e.g., FET 522 is "off"), which results in the effect of the differential current in transitors 514, 516 being maximized. On the other hand, when FET 522 is conducting and forward gain G is increased, the increased cross-coupling between the emitters of transistors 514, 516 decreases the effect of the differential currents, thereby lowering the offset gain factor A.

In an alternative embodiment, the form of the amplifier of FIG. 5 may be used for the offset loop amplifier as well, where the gain of the offset loop amplifier is controlled by adjusting the degeneration resistance of the offset loop amplifier. In this alternative embodiment, the output voltage of the amplifier is applied to a voltage summing node at the input to the forward gain amplifier as shown in FIG. 2.

Figure 7:
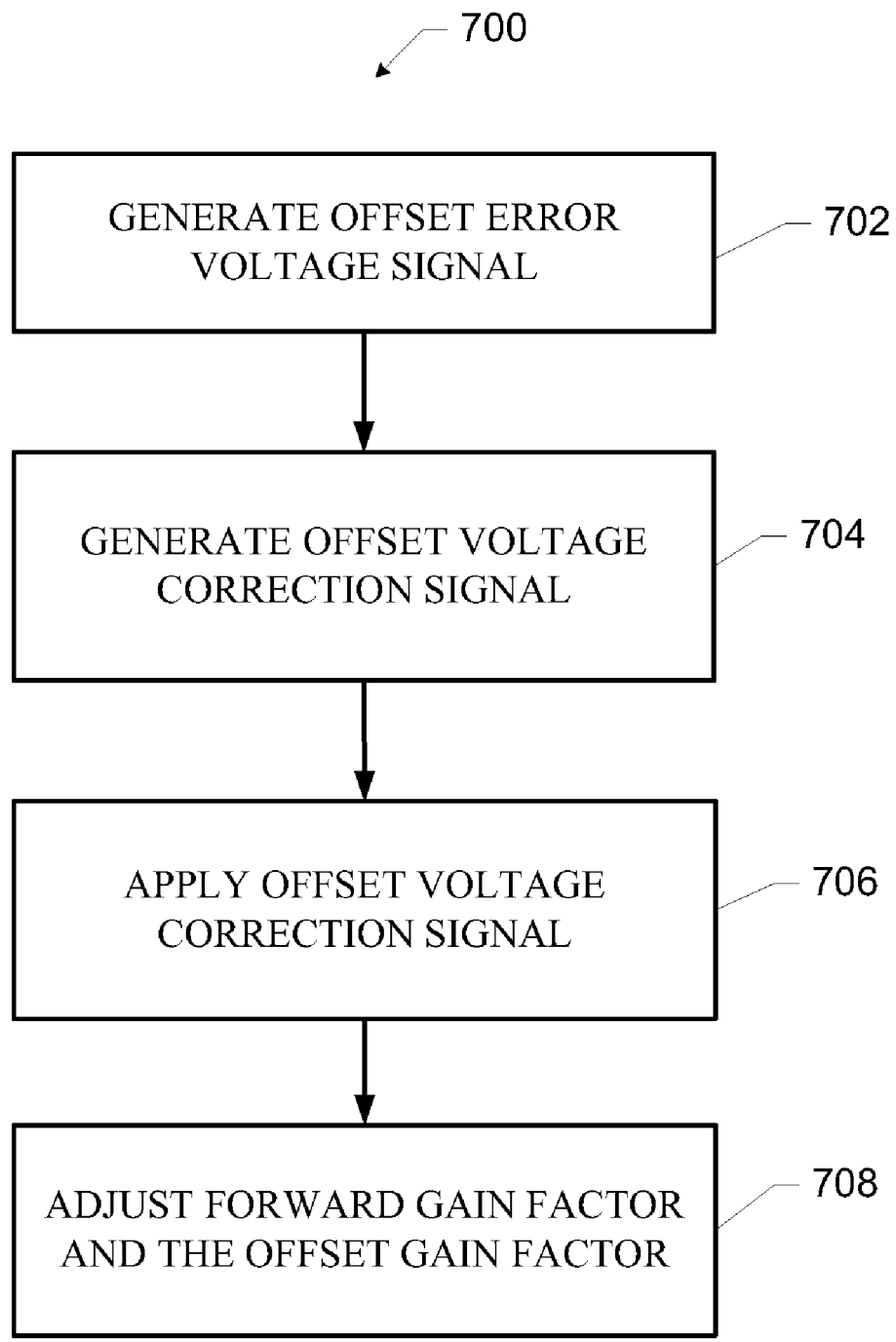
FIG. 7 depicts a preferred method of controlling offset voltage errors.

With respect to FIG. 7, one preferred method 700 for cancelling a voltage offset in a variable gain amplifier will be described. At step 702, an offset error voltage signal indicative of an offset voltage present at a differential output of a variable gain amplifier is generated. At step 704, the offset error voltage signal is received at an offset loop amplifier, and responsively generating an offset voltage correction signal. At step 706 the offset voltage correction signal is applied to the variable gain amplifier. At step 708, the forward gain factor of the variable gain amplifier and the offset gain factor of the offset loop amplifier are adjusted. Preferably, when the forward gain factor is increased, the offset gain factor is decreased. That is, increasing the forward gain factor tends to increases a lower cutoff frequency of the combined amplifier and offset cancellation loop, whereas decreasing the offset gain factor is done in order to lessen the impact by reducing the amount of increase of the lower cutoff frequency. Thus, the offset gain factor is adjusted to a minimum when the forward gain factor is adjusted to a maximum.

In one application suitable for using the circuits and methods described herein, the amplifier and offset loop circuit may be used as an automatic gain control (AGC) amplifier whose gain is adjusted to accommodate input signals of rapidly varying amplitude. For example, in many optical communication systems, systemic power transients may result from the operation of optical add/drop multiplexers. The circuits and methods described herein may be used to track the rapid changes in signal levels as a result of the power transients while still maintaining a desired frequency response at low frequencies so as to prevent signal degradation. The offset loop amplifier preferably includes a low pass filter having an low pass cutoff frequency approximately equal to an average power transient frequency associated with the input signal. For a 10 GHz optical transmission system, the upper cutoff frequency may be selected to be between approximately 1 kHz and 6 kHz.

The claims should not be read as limited to the described order of elements unless stated to that effect. In addition, use of the term "means" in any claim is intended to invoke 35 U.S.C. §112, paragraph 6, and any claim without the word "means" is not so intended. Therefore, all embodiments that come within the scope and spirit of the following claims and equivalents thereto are claimed as the invention.

We claim:

1. A method for cancelling a voltage offset in a variable gain amplifier, comprising:
    generating an offset error voltage signal indicative of an offset voltage present at a differential output of a variable gain amplifier, the variable gain amplifier having a forward gain factor;

receiving the offset error voltage signal at an offset loop amplifier, the offset loop amplifier having an offset gain factor, and responsively generating an offset voltage correction signal;

applying the offset voltage correction signal to the variable gain amplifier; and, simultaneously adjusting the forward gain factor of the variable gain amplifier and the offset gain factor of the offset loop amplifier.

2. The method of claim 1 wherein simultaneously adjusting the forward gain factor and the offset gain factor comprises decreasing the offset gain factor and increasing the forward gain factor.

3. The method of claim 2 wherein the variable gain amplifier and the offset loop amplifier have a combined frequency response having a lower cutoff frequency, and wherein increasing the forward gain factor increases the lower cutoff frequency and wherein decreasing the offset gain factor is done in an amount to lessen the increase of the lower cutoff frequency.

4. The method of claim 2 wherein the offset gain factor is adjusted to a minimum when the forward gain factor is adjusted to a maximum.

5. The method of claim 1 wherein the variable gain amplifier comprises a differential pair of transistors with an emitter degeneration impedance.

6. The method of claim 1 wherein the variable gain amplifier comprises a differential pair of transistors, and wherein applying the offset voltage correction signal to the variable gain amplifier is performed by applying a differential current source to the differential transistor pair.

7. The method of claim 1 wherein the variable gain amplifier comprises a differential pair of transistors having a variable emitter degeneration resistor, wherein applying the offset voltage correction signal to the variable gain amplifier is performed by applying a differential current source to the differential transistor pair, and wherein decreasing the resistance of the variable emitter degeneration resistor increases the forward gain factor and decreases the offset gain factor.

8. The method of claim 1 wherein the forward gain is adjusted in response to an automatic gain control circuit.

9. The method of claim 1 wherein the offset loop amplifier includes a low pass filter having an upper cutoff frequency approximately equal to an average power transient frequency.

10. The method of claim 9 wherein the upper cutoff frequency is between approximately 1 kHz and 6 kHz.

11. An amplifier apparatus comprising:
a variable gain forward amplifier having an input, an offset control input, and an output;
a variable gain offset loop amplifier connected from the output to the offset control input to provide feedback to reduce the amount of voltage offset present at the output;
a gain control circuit connected to the forward amplifier and the offset loop amplifier for increasing a forward gain factor of the forward amplifier and simultaneously decreasing an offset loop gain factor of the offset loop amplifier.

12. The apparatus of claim 11 wherein the offset control input is an input to a voltage summer.

13. The apparatus of claim 11 wherein the forward amplifier comprises a differential pair of transistors and the offset control input is a differential current source applied to the differential pair of transistors.

14. The apparatus of claim 13 wherein the forward amplifier comprises an emitter-degeneration impedance coupled between emitters of the differential pair of transistors and wherein decreasing the degeneration impedance increases the forward gain factor of the forward amplifier and simultaneously decreases the offset loop gain factor of the offset loop amplifier.

15. The apparatus of claim 11 wherein the forward amplifier amplifies signals having power transients according to a power-transient slew rate, and wherein the variable gain offset loop amplifier includes a low pass filter having a filter slew rate approximately equal to the power-transient slew rate.

16. The apparatus of claim 11 wherein the variable gain offset loop amplifier comprises a second differential pair of transistors having a second emitter-degeneration impedance coupled between emitters of the second differential pair of transistors.

* * * * *